United States Patent
Dyck et al.

(10) Patent No.: US 6,529,239 B1
(45) Date of Patent: Mar. 4, 2003

(54) IMAGE SENSOR WITH STRIPES OF CYAN FILTER MATERIAL PERPENDICULAR TO STRIPES OF YELLOW FILTER MATERIAL

(75) Inventors: Rudolph H. Dyck, Palo Alto, CA (US); Inderjit K. Aulakh, Saratoga, CA (US)

(73) Assignee: Fairchild Imaging, Inc., Milpitas, CA (US)

( * ) Notice: Subject to any disclaimer, the term of this patent is extended or adjusted under 35 U.S.C. 154(b) by 0 days.

(21) Appl. No.: 09/088,137

(22) Filed: Jun. 1, 1998

(51) Int. Cl.⁷ .............................................. H04N 5/225
(52) U.S. Cl. ........................................ 348/279; 348/277
(58) Field of Search .................................. 348/207, 342, 348/335, 360, 311, 272, 273, 275, 276, 277, 278, 281; 437/225, 2, 3, 4; H04N 5/225

(56) References Cited

U.S. PATENT DOCUMENTS

| | | | |
|---|---|---|---|
| 4,450,475 A | | 5/1984 | Ishikawa et al. |
| 4,516,154 A | | 5/1985 | Nishizawa et al. |
| 4,580,160 A | | 4/1986 | Ochi et al. |
| 4,646,139 A | | 2/1987 | Takei et al. |
| RE32,492 E | | 9/1987 | Takemura |
| 4,721,999 A | | 1/1988 | Takemura et al. |
| 4,939,573 A | * | 7/1990 | Teranishi et al. ............ 348/276 |
| 4,951,130 A | | 8/1990 | Iizuka et al. |
| 5,028,547 A | | 7/1991 | Iizuka et al. |
| 5,132,251 A | * | 7/1992 | Kim et al. ..................... 438/70 |
| 6,236,434 B1 | * | 5/2001 | Yamada ....................... 348/315 |

OTHER PUBLICATIONS

Khosla "From Photons to Bits," Physics Today pp. 42–49 (Dec. 1992).

Koike et al. "Heat–and Light–Resistance Characteristics of an MOS Imaging Device with Momlithically Integrated Color Filters," IEEE Transactions on Electron Devices ED–32:1475–1479 (1985).

Parulski "Color Filters and Processing Alternatives for One–Chip Cameras," IEEE Transactions on Electron Devices ED–32:1381–1389 (1985).

* cited by examiner

*Primary Examiner*—Tuan Ho
(74) *Attorney, Agent, or Firm*—Townsend and Townsend and Crew LLP (57) ABSTRACT

A CCD image sensor with a color filter array (CFA) for color imaging involves stripes of Cyan and of Yellow filter material on the imaging surface of a CCD array, preferably a full-frame (FF) CCD imager, with the two sets of color stripes arranged perpendicular to each other and one set parallel to the array axes to form two layers at the areas where they cross. Unit color cells comprise 2-pixel by 2-pixel blocks, each containing a Cyan, a Yellow, a Green (where the stripes overlap), and a White (where there is no stripe) pixel. Also, the longitudinal set can be segmented into two pixels or more in length, and the segments transversely displaced or staggered to form an elongated checkerboard pattern to compensate for devices with single-column blemishes. In fabrication, the filter stripes of one color are deposited crossing over the others to form two layers with different thicknesses so that the later deposited stripe has spectral properties in the cross-over regions distinctly different from non-cross-over regions, permitting the production of a four-color image CCD sensor chip with fewer fabrication steps and improved yield. The resulting chip has the sensed image charge read out after only one exposure to generate the desired color image data file, and a 2×2 pixel block of a unit cell can be virtually shifted by one pixel both longitudinally and transversely so that complementary 2×2 pixel blocks can also be used to generate unique color image data. Another arrangement using Cyan and Yellow filter material in the form of circular discs or octagons is also disclosed.

7 Claims, 5 Drawing Sheets

| G | Cy | G | Cy | G | Cy | G |
|---|---|---|---|---|---|---|
| Ye | W | Ye | W | Ye | W | Ye |
| G | Cy | G | Cy | G | Cy | G |
| Ye | W | Ye | W | Ye | W | |
| G | Cy | G | Cy | | | |
| Ye | W | Ye | W | | | |
| G | Cy | G | | | | |
| Ye | W | | | | | |

IMAGE SENSOR WITH STRIPES OF CYAN FILTER MATERIAL PERPENDICULAR TO STRIPES OF YELLOW FILTER MATERIAL

BACKGROUND OF THE INVENTION

1. Field of the Invention

The present invention is directed to charge-coupled device (CCD) image sensors and more particularly to providing a technique and arrangement for achieving advantageous color filtering for CCD image sensors.

2. Prior Art

Figure 1:
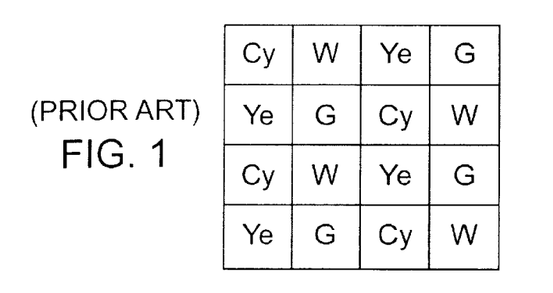
FIG. 1 illustrates a prior art color filter array (CFA) made up of 2-pixel by 2-pixel blocks having a set of complementary transmitted colors including Cyan, White, Yellow, and Green pixels.
Figure 2:
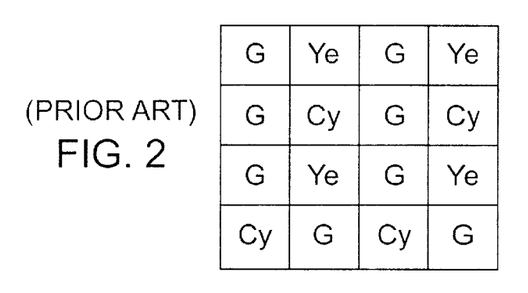
FIG. 2 shows a prior art complementary frequency interleaving CFA of 2-pixel by 2-pixel blocks with a pattern of Green, Yellow, Green, and Cyan pixels.
Figure 3:
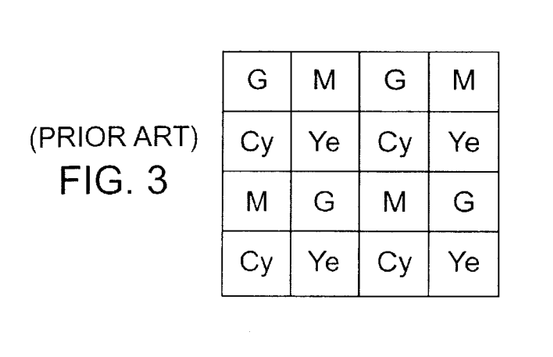
FIG. 3 illustrates another prior art color mosaic design, a "GCMY" complementary CFA, with Green, Magenta, Cyan, and Yellow pixels.
Figure 4:
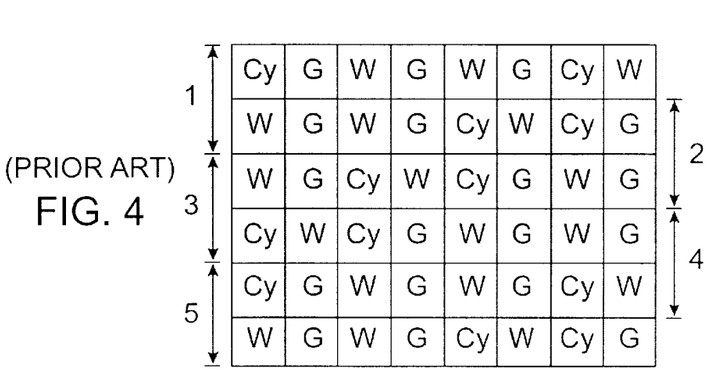
FIG. 4 illustrates a prior art symmetric shift complementary CFA with Cyan, Green, and White pixels for use with a full-frame type CCD device.

Image sensors using color-filter arrays (CFAs) with solid-state CCD arrays to capture color images electronically are generally well known in the art as indicated, for example, in the article entitled, "From Photons to Bits" by R. P. KHOSLA in "PHYSICS TODAY", December 1992, pps. 42–49. A very powerful color system has been used in these image sensors for some time, such as in color vidicons, e.g., SONY Trinicons, which system involves the use of diagonal criss-crossing stripes of Yellow and Cyan filters that form 2×2-pixel blocks consisting of a Cyan, a Yellow, a Green, and a White (full response) pixel, with the Green being the result of a Cyan and Yellow overlap. A pattern for such a color filter array (CFA) is shown in FIG. 1 which illustrates an Hitachi complementary transmitted color CFA as disclosed by H. NABEYAMA ET AL., in "IEEE Transactions on Consumer Electronics", vol. CE-27, pp. 40–45, 1981. Complementary color CFAs of this type are typically used in low-light camcorder applications and have various forms. For instance, this layout design, which is used for interlaced television scanning, could be made using just a Cyan and a Yellow filter application, but the layout would not take the form of Cyan stripes or Yellow stripes. Further, FIG. 2 shows the Toshiba complementary frequency interleaving CFA with Green, Yellow, and Cyan pixels as disclosed by K. A. PARULSKI, in "Color Filters and Processing Alternatives for One-Chip Cameras", IEEE Transactions on Electron Devices, vol. ED-32, pp. 1381–1389, August 1985, and FIG. 3 illustrates another color mosaic design, a "GCMY" complementary CFA, using Green, Cyan, Magenta, and Yellow, as disclosed by F. ASCHWANDEN ET AL., in "Single-Chip Color Camera Using a Frame-Transfer CCD", IEEE Transactions on Electron Devices, vol. ED-32, pp. 1396–1401. In the latter article by F. ASCHWANDEN ET AL., a "symmetric shift complementary CFA" is also disclosed of the form illustrated in FIG. 4.

Other examples of this general type of color filtering are disclosed in U.S. Pat. Nos. 4,450,475; 4,516,154; 4,580,160; 4,646,139; 4,721,999; 4,951,130; 5,028,547; and RE 32,492. There are also prior art filter arrangements wherein the colored stripes all are parallel to each other.

As to the solid-state CCD arrays, CCD imagers formed from solid-state arrays, as explained in the above-cited "PHYSICS TODAY" article, may be of the interline transfer (IT) type, composed of vertically stacked linear scanners, or of the frame transfer (FT) type, with each CCD pixel being a photosensing element in an integration-frame array that transfers captured charge to a storage-frame array. Another form is the full-frame (FF) type, wherein the pixels are generally square and their charge is read out individually. Existing CCD imagers are predominantly of the interline (IT) type, although frame transfer (FT) type CCD imagers have many high-performance advantages, such as higher resolution per pixel with less aliasing effect, but at a comparatively higher cost. The full-frame (FF) type is comparatively simpler than the IT and FT types as it does not use interlacing in its operation.

From another standpoint, there are two common types of area-array image sensors, i.e., 2-field-interlaced arrays and progressive-scan arrays. The first type to become commonly used was the interlaced arrays for television cameras, the predominant architecture of which was of the interline transfer (IT) type. The CFA designs for this type of imager were optimized for camcorder recorder bandwidths and generally are scanned so that in any one field all the rows are read out in pairs. The color mosaic design CFAs of the prior art have generally been used with field-interlaced television cameras or imagers where both fields must have essentially the same balance of color information. The simplest type of progressive-scan sensor is the full-frame (FF) type. For this type of sensor an optimized CFA will tend to be different. As with the interlaced arrays, however, the same CCD architectures can be used with the progressive-scan array, i.e., IT, FT, and FF. In both types of area-array image sensors it is desired to achieve high luminance and chrominance resolution, but in the progressive-scan type the design problem is not complicated by the feature of field-interlacing and matching of performance.

In one example of a large, high resolution image sensor, the yield in the fabrication of representative full-frame (FF) type CCD imagers without color filters typically runs about 2.4 good dice per wafer. But, with color filter-related steps this drops to about 1.2, i.e, the drop in yield may approach 50%. A color-filter imager fabricating process may typically use 6 masks, and have 5 patterned layers and 4 colors, with the last of these colors yielding at a much lower rate than the others. The present processes generally are too complex and expensive even assuming that there are 5 equally-yielding steps and no others.

Problem to be Solved:

It will therefore be seen that a CCD color imager would be desirable that could provide the highest resolution per pixel, have the least aliasing effect, and not be too expensive to manufacture.

Objects:

It accordingly is an object of the present invention to provide a method and means for making high performance color imagers in a relatively low cost way.

It is another object of the present invention to provide a method and means for fabricating high performance color imagers with an improved yield.

It is a further object of the present invention to provide a full-frame (FF) type CCD imager with improved color filtering that is comparatively less expensive and less complex to fabricate.

SUMMARY OF THE INVENTION

The present invention is directed to CCD image sensors with color filters for color imaging and involves depositing stripes of Cyan and stripes of Yellow filter material on the imaging surface of a CCD array in an image sensor, preferably a full-frame (FF) CCD imager or a progressive-scan frame-transfer CCD imager, and arranging these stripes perpendicular to each other and parallel to the array axes to form two layers at the areas where they cross. This arrangement can be used with appropriate spacing to form unit color cells comprising 2-pixel by 2-pixel blocks, with each block containing a Cyan, a Yellow, a Green (where the stripes overlap), and a White (where there is no stripe) pixel. Alternatively, the longitudinal or vertical stripes can be modified into segments of two pixels or more in length, and these segments may be displaced transversely or horizontally, i.e., staggered, so as to form an elongated checkerboard pattern. This variation in the arrangement has the advantage that, in a device that has single-column blemishes, the computed and interpolated pixel signal levels along such a blemish are on average more accurate and therefore these blemishes will not be as conspicuous.

Another feature of the invention involves a two layer filter stripe deposition technique wherein the upper stripe, i.e., later deposited stripe, can be fabricated so that its spectral properties in the areas or regions where it is deposited over the first deposited stripe are distinctly different from those regions where it is not deposited over the first stripe. This feature can be used to advantage to produce a four-color image sensor. For example, with the Yellow stripe on top, it is possible to distinguish between Blue and Violet so as to better handle the gamut of Bluish-Purples. Also, because there are only two color layers and because the dimensions of stripes are easier to control than the dimensions of pixel-sized squares that tend to have rounded corners and thus involve one more process control issue, the present two-stripe approach and arrangement is advantageous in the fabrication of an imager chip and in the yield obtained.

In operating the resulting full-frame CCD imager chip, the sensed image charge is read out after only one exposure. During or after readout, signal processing is done to generate the desired color image data file. The data file may be a Red-Green-Blue (RGB) file, a LUMINANCE-CHROMINANCES a and b file, or some other type of color image file. The Cyan-Yellow stripe color design has several unique color-output features. The unit cell, as noted, may be a block of 2 pixels by 2 pixels made up of a Green, a Cyan, a Yellow, and a White pixel. From one of these blocks, the Red level is {White (W) minus Cyan (Cy)}, and the Blue level is {White (W) minus Yellow (Ye)}. The LUMINANCE level is the sum of all four pixel levels. In between these 2-pixel×2-pixel blocks, by virtually shifting one pixel both vertically and horizontally, there are complementary 2×2 pixel blocks that can also be used to generate unique color image data.

A further arrangement using Cyan and Yellow filter material in the form of circular discs or octagons to form the 2-pixel by 2-pixel blocks containing the Cyan, Yellow, Green, and White pixels is also disclosed.

DETAILED DESCRIPTION OF THE PREFERRED EMBODIMENTS

Figure 5:
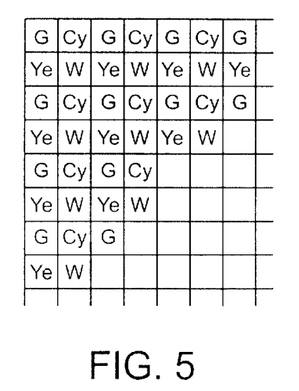
FIG. 5 illustrates a color filter in accordance with the present invention having stripes of Cyan and of Yellow filter material, disposed on the surface of a CCD array of a full-frame (FF) image sensor, in two layers parallel to the array axes and perpendicular to each other to form a matrix of 2-pixel by 2-pixel blocks, with each block containing a Green pixel (where the stripes overlap), a Cyan pixel, a Yellow pixel, and a White pixel (where there is no stripe).
Figure 6:
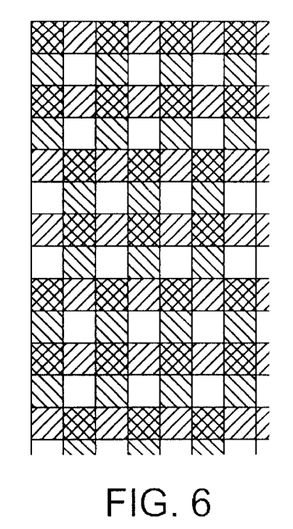
FIG. 6 illustrates an alternative or modified form of the color filter shown in FIG. 5 wherein the longitudinal stripes are divided into segments by changing their lengths, e.g., to four pixels in length, and then staggering the segments transversely so as to form an elongated checkerboard pattern.

The present invention involves CCD image sensors with color filter arrays (CFAs) and more particularly is embodied in an arrangement and technique for providing advantageous color filtering for CCD image sensors, and particularly full-frame (FF) CCD imagers and progressive-scan frame-transfer (FT) CCD imagers. In accordance with the invention a color filter array (CFA) is formed by successively depositing Cyan and Yellow filter material on the surface of a CCD sensing array, e.g., a full-frame (FF) image sensor, and arranging these materials to produce a first set of stripes of one color, parallel to the CCD array axes, and a second set of stripes of the other color, perpendicular to the first set, forming two layers at their crossing regions. In one embodiment the stripes are disposed orthogonally in continuous lengths and spaced to form a matrix of 2-pixel by 2-pixel blocks, with each block containing a Green pixel in the upper left hand corner (where the stripes overlap), a Cyan pixel in the upper right, a Yellow pixel in the lower left, and a White pixel in the lower right hand corner (where there is no stripe), such as shown in FIG. 5. In an alternative embodiment, the vertical stripes can be modified into segments by changing their lengths, to two or more pixels in length, and then staggering the segments so as to form an elongated checkerboard pattern in the manner of a standard television, with, e.g., four pixel lengths, as shown in FIG. 6. This modification has the advantage that, as explained more fully below, in a device that has missing columns or single-column blemishes, the computed pixel signal levels at such defective regions or blemishes are spread out and therefore not as conspicuous.

Figure 7:
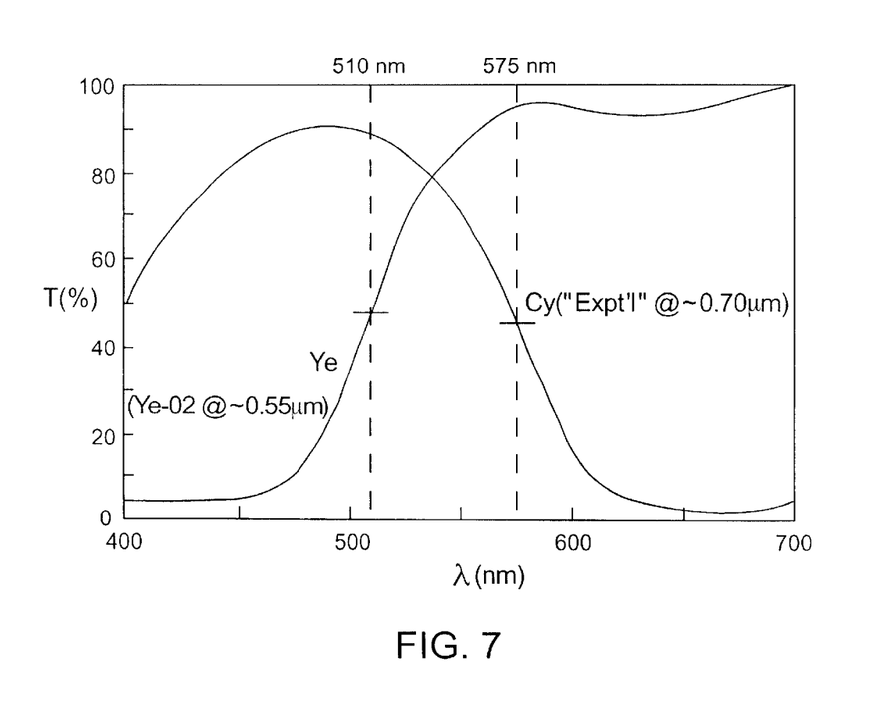
FIG. 7 illustrates a plot of an Optimized Cyan and Yellow transmittance spectra (T-Spectra) that is optimized for a standard TV beam-splitter color separation.

The arrangement of the former or first embodiment may be used to provide a color filter using Cyan and Yellow orthogonally-arranged stripes on a full-frame CCD imager having 15 μm pixels. In current imager devices of this type, having no special processing to enhance Blue responsivity, the amounts of Cyan and Yellow absorbance, and the shapes of the transmission spectra, are determined so that the resultant Red, Green, and Blue (RGB) spectra have the optimum cross-over characteristics. When properly weighted, taking into account the range of color temperatures of illumination, and taking into account the RGB proportions desired for an optimum luminance signal, the Blue-Green cross-over is near 500 nm, and the Green-Red cross-over is near 575 nm, as illustrated in FIG. 7, which shows a plot of an Optimized Cyan and Yellow transmittance spectra (T-Spectra) that is optimized for a standard TV beam-splitter color separation. These values may be used in this first embodiment with a CCD device having no enhancement of its Blue responsivity. In other embodiments where the CCD device has better Blue response, the Cyan and Yellow filter characteristics may be adjusted. However, since CCD devices have relatively poor Blue response, and since transfer efficiencies are never perfect, it is advantageous to carefully determine which transfer efficiency tends to be worse, and to avoid that direction in the determination of the Blue signal, i.e., W–Ye.

The alternative or second embodiment, as mentioned above, involves a filter arrangement which may have vertical filter segments that are two or more pixels in length, e.g., two pixels in length, and staggered to produce a staggered pattern of 2-pixel by 2-pixel blocks. In a similar way it is possible to achieve advantages with other modified layout designs, but in all of these array patterns, the invention provides for at least one of the color filters to be laid out as simple continuous stripes in one direction, e.g., transverse or horizontal stripes all across the array. The use of long stripes, as compared to short segments or squares, offers the advantage that there are fewer corners in the CFA per pixel, on average, since the long stripes are continuous over their length and the coincident long edges of the short segments are avoided. This coincidence tends to produce excessive non-uniformity, such as rounded corners, as is generally the case when two edges in a multilayer structure lie within the photolithographic resolution capability of the patterning system. The comparison may be seen from a consideration of FIG. 6.

With either the first or second embodiments, the Cyan and Yellow stripes of the color filter arrangement can be fabricated by a process involving 2 steps that can produce a yield amounting to at least as much as the current 5 step processes. The current processes typically use a grid with square apertures and square CFA patterns to achieve good uniformity, e.g., of the order of 2% rms. However, the stripes of the invention are more uniform, as they avoid the "rounded corner" problem associated with the squares. Further, the yield per step can be better than that of the current processes because: (a) the stripes will not lift as readily as squares; and (b) the problem in the 5 step processes of the later deposited layers of color being less controllable than the earlier deposited ones, is obviated. Therefore, the yield of the Cy/Ye process of the invention> $(0.5)^{2/5}=0.76$.

An exemplary process for depositing the Cyan and Yellow stripes on a 4K×4K array sensor may be carried out as follows. To achieve a preferred spacing, first a Cyan stripe is placed over each odd-numbered row of the CCD array and then a Yellow stripe is placed over each odd-numbered column to form a grid or matrix of suitably spaced color elements. In the areas or regions where the stripes overlap, Green transmission will result. Where there is no filter material, the element is designated as "White", i.e., transmitting all colors. The color unit cell will be a 2-pixel by 2-pixel block in the pattern as noted above, i.e.,:

| G | Cy |
|---|----|
| Ye | W |

In operation, each 2×2 pixel block provides the following information:

Red=W–Cy

Blue=W–Ye

Luminance=G+Cy+Ye+W

Furthermore, a 4K×4K CCD sensor has 3999×3999 unique luminance samples. This may be seen by considering a 4×4 block:

| G  | Cy | G  | Cy |
|----|----|----|----|
| Ye | W  | Ye | W  |
| G  | Cy | G  | Cy |
| Ye | W  | Ye | W  |

Note that there are nine 2×2 blocks from which signals can be read out by virtually shifting a 2×2 block one luminance sample at a time both vertically and horizontally that will provide equivalent but unique luminance samples. This is one of the key advantages of this color system over prior systems.

Similarly, it will be seen that the 4K×4K sensor provides:

2000×2000 unique samples of Green,

2000(h)×3999(v) unique samples of Red, and

3999(h)×2000(v) unique samples of Blue.

In this exemplary process it is preferred that the Yellow stripe be deposited on top of the Cyan stripe, i.e., the Yellow stripe layer passes over the Cyan stripe layer in their cross-over regions. The Yellow layer may be thinner, but the change in the quality of the resultant color system (W, G, Cy, Ye) will be better. Although the thickness of the Yellow layer in the regions over the Cyan layer may be less by about 20%, this arrangement may be improved by the use of a planarizing layer of polyimide over the first deposited stripes. Whether thinner or not, the upper color stripe may be deposited in a way that results in a nearly or substantially constant thickness and constant color quality, in both the cross-over regions and the non-cross-over regions. The lower color stripe may also be of substantially constant thickness.

An alternative processing approach in accordance with the invention follows from the recognition that if the stripe thicknesses are somewhat different, an opportunity is provided to get additional color image information. For example, the thickness of the upper may be varied so as to differ in the cross-over regions and the non-cross-over regions. The thickness difference can be made larger or smaller during fabrication so as to control the amount of added color information. In any case, the end user can exploit any difference so as to increase the color discrimination capability in a selected application. As is explained below, the end user can select one of the sets of three colors, or use four colors or even five. Accordingly, a device may be fabricated with the Yellow stripe being the upper one, and the optical and physical properties of the Yellow material being such that it can be applied in a manner whereby the absorption edge center shifts by approximately a 20 nm wavelength. The end result is an image sensor having the signals: normal Red, nearly-normal Green, nearly-normal Blue, and a small Blue-Green increment that can be called Blue or Green. Consequently, users may have an added degree of freedom to produce the image they like best. The particular Blue-to-Green transition that is preferred by the camera user will tend to depend on the color temperature of the illumination, and can be more significant where the basic sensor has relatively low Blue sensitivity.

Figure 8:
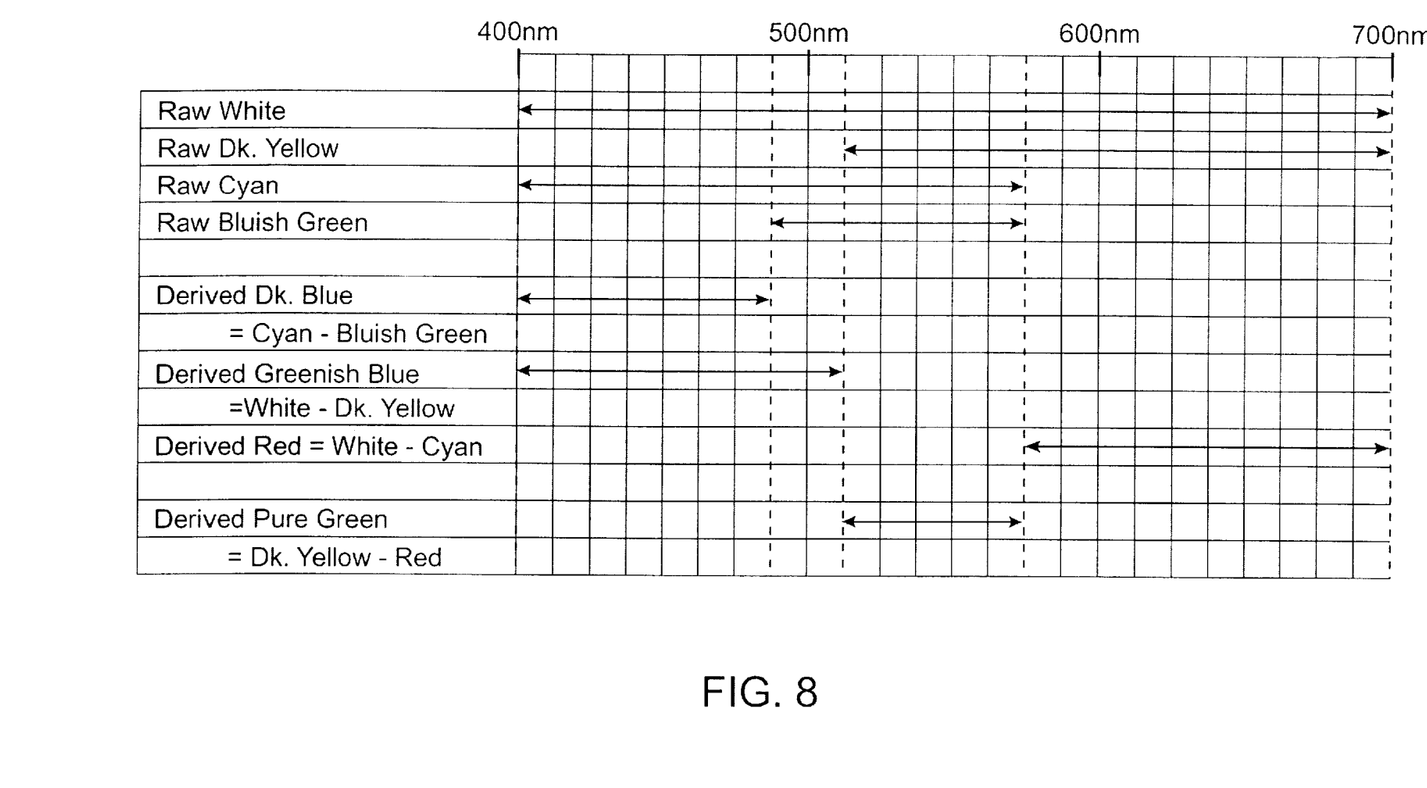
FIG. 8 illustrates the color relationships resulting when the upper or last-deposited stripe, of the two-stripe filter of FIG. 5, is Yellow with thicknesses in the one-layer regions and in the two-layer regions being such that the 50% points of the Yellow transmittance spectra are at substantially different wavelengths, for instance, one 50% point is near 490 nm and the other is near 510 nm.

A specific example of this further processing approach, illustrated with reference to FIG. 8, has the Yellow stripe as the upper or second one with thicknesses in the one-layer regions and in the two-layer regions being such that the 50% points of the Yellow transmittance spectra are at substantially different wavelengths. For instance, one 50% point could be near 490 nm (dotted line A) and the other (dotted line B) could be near 510 nm. As seen in FIG. 8, the first point (A) will give a Bluish-Green pixel and the second one (B) will give a Dark Yellow pixel. This condition is beneficial in that it enables four colors to be determined instead of just three. Having determined four colors, it can be decided whether to use all four, or a first set of three, or a second set of three. A Greenish-Blue signal is obtained from {W−Dark Ye} and a pure Blue signal is obtained from {Cy−Bluish-Gr}. Also, pure Green can be obtained from {Dark Ye+Cy−W}. Thus, in this one example it will be seen that several color rendition approaches are possible. The optimum for any particular class of applications or any particular image will depend on the color discrimination that is desired and the strength of the exposure, i.e., the signal to noise ratio in the raw image data file.

Figure 9:
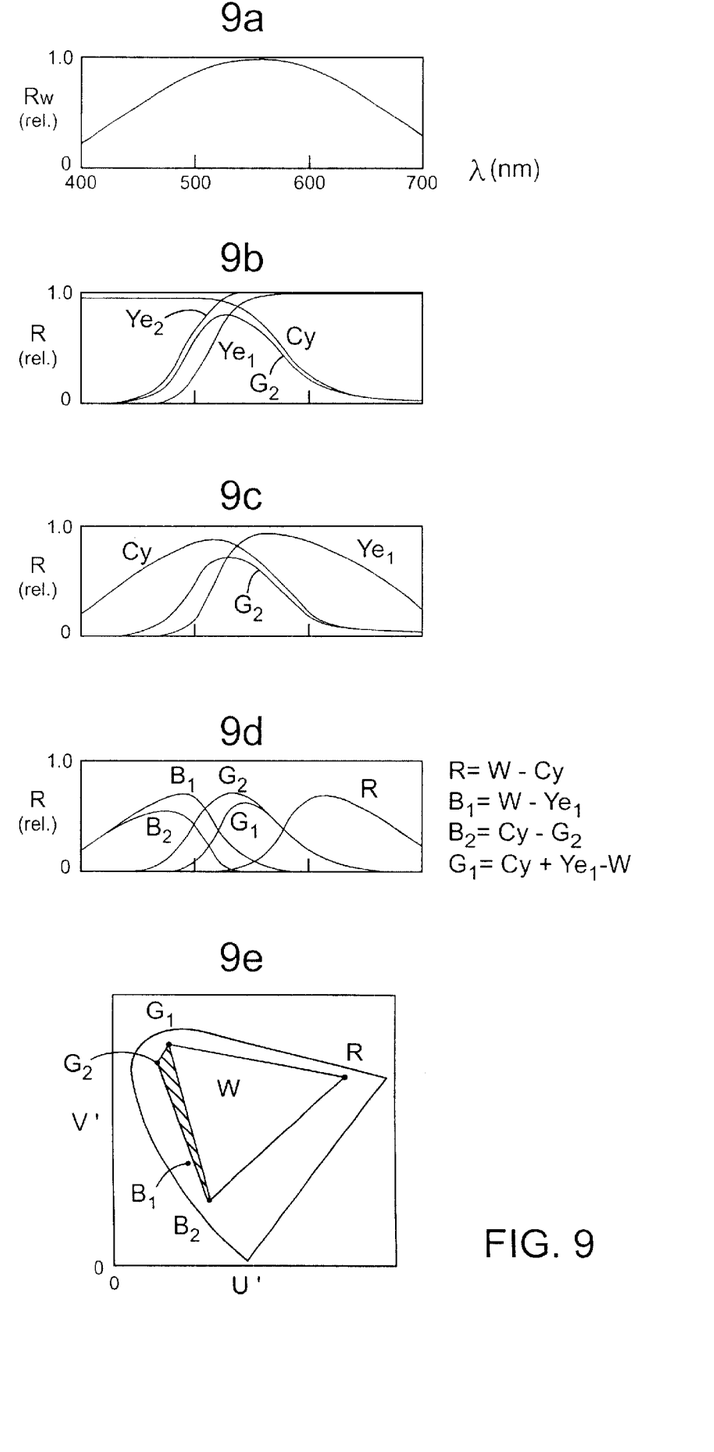
FIGS. 9a–9e illustrate examples of the transmission spectra together with the spectra responses that result from the use of two thicknesses of a Yellow upper coating to increase color information.

To further explain the ways in which two thicknesses of a Yellow upper coating stripe can be used to increase color information, FIGS. 9a–9e illustrate examples of the transmission spectra (relative) together with the spectra responses that result. FIG. 9a shows the response spectrum $R_w$ of the monochrome sensor. In the completed color sensor, this will be the spectrum of the White pixels. FIG. 9b shows the filter transmission spectra T. The Yellow filter stripe is thicker where it lies directly on the underlying sensor so at that area its transmittance is less, especially near 500 nm. The curve for this thicker region is labelled $Ye_1$. Where the Yellow layer lies over the Cyan layer, it is thinner and the spectrum there is shown as a dashed curve and labelled $Ye_2$. The transmission spectra for the Cyan layer and the second Green pixel (curves Cy and $G_2$) are also shown. The spectral response $R_c$ curves of the three types of color pixels, $Ye_1$, Cy, and $G_2$, are shown in FIG. 9c. The monochrome type of pixel is the fourth type such as shown in FIG. 9a. FIG. 9d shows the two Blue signals, $B_1$ and $B_2$, and the second Green signal $G_2$, that can be derived from the raw signals, as well as the first Green signal $G_1$ and the Red signal R. Thus, it will be seen that the result of having two thicknesses of Yellow material is to actually enable the deriving of two Blues, $B_1$ and $B_2$, and two Greens, $G_1$ and $G_2$.

FIG. 9e shows the chromaticites of these bands for one particular exemplary case of illumination spectrum. It is desirable to maximize the area inside the color polygon, and it is also desirable to have an integrated response spectrum so that the full visible spectrum in a smooth function of wavelength is without large dips. In this example, the area inside the U'V' chromaticity space is maximized, in a 3-color image processing method, by using R, $G_1$, and $B_2$, and somewhat of a dip in integrated response occurs near 500 nm. To further increase the area inside the polygon one Blue and both Greens could be used in a 4-color image processing method. A full analysis of the advantages and disadvantages of these two processing methods, in comparison with each other, can be accomplished using appropriate sample imagery of the type to be captured, and the determining of signal-to-noise ratios and the level of any aliasing phenomena.

Another processing approach in accordance with the invention involves using the Cyan stripe as the second color stripe and two thicknesses of Cyan filter material, which results in a corresponding small increment of Yellowish-colored spectrum that can be added either to the Green or to the Red. In this fabrication process, the controlling of the difference in thickness may be accomplished by adjusting the thickness of the first or lower color stripe while making the nominal thickness of the second color stripe constant. As the first stripe is made thicker, the second stripe will tend to have more and more of a thickness difference. Of course, as the thickness of the first stripe is changed it is also ncessary to adjust the concentration of the dye so that the first spectrum is maintained constant. It will be seen that the two-stripe approach and arrangement of the invention offers improved filter versatility and is advantageous in facilitating the fabrication of an imager chip and in the yield that can be obtained.

Figure 10:
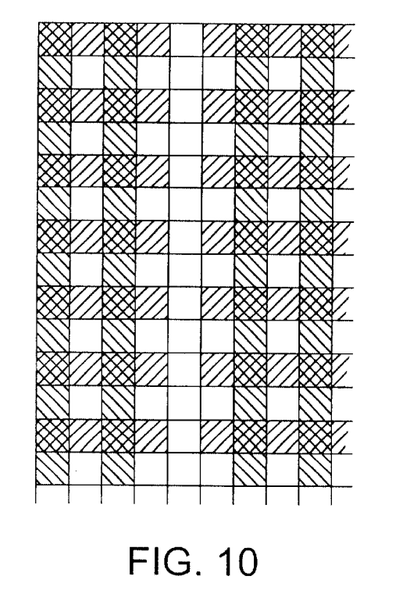
FIG. 10 illustrates a possible defective CCD imager array wherein the full-height color stripes have a missing column and thus the reproduced image is without that particular column's color data.
Figure 11:
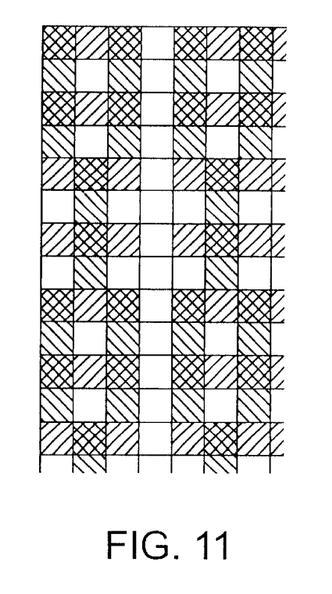
FIG. 11 shows a CCD imager with color filter in accordance with the modified form of the invention shown in FIG. 6 wherein the transverse or horizontal filter stripes are full length but the vertical stripes are segmented and the segments are staggered transversely and illustrates how, in the event there is a possible defective or missing column of pixels as in FIG. 10, an entire column of image information is not lost.

An important application of the alternative embodiment of the invention involving fabricating stripes in segments that do not go the full length of the array, is to compensate for the problem of a possible defective or missing column of pixels and the loss of an entire column of image information. This problem is illustrated in FIG. 10 wherein the set of full height or length color stripes has a missing column and thus the resulting image is without the particular column color data. The improved embodiment is shown in FIG. 11 wherein the horizontal filter stripes are full length but the vertical stripes are segmented and the segments are staggered. With this embodiment if there is a possible defective column of pixels an entire column of image information is not lost and the quality of interpolation of the imagery across the gap is made more favorable by having the columns staggered. In FIG. 11 each segment is shown as four pixels long, but the segments can be longer or shorter, such as three pixels, or five pixels or more in length. The optimum choice, if this embodiment is to be used in a camera, would be effected by the cost of the image processing software and hardware, weighed against the cost of achieving the desired pixel uniformity as the sensor is manufactured.

Figure 12:
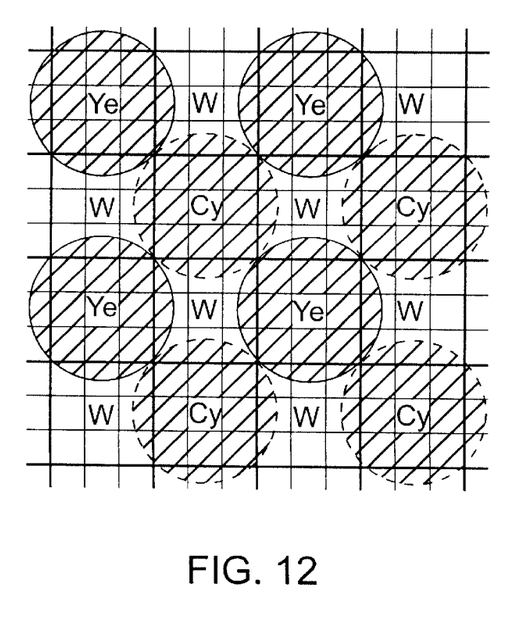
FIG. 12 illustrates a further embodiment of a CCD imager with a "cornerless" filter design using circular patterns of Cyan and Yellow filter material, the diameters of which circles are substantially equal to the diagonals of the square pixels on which they are deposited.

As explained above, this alternative embodiment may suffer to some extent from the "rounded corner" problem. A further embodiment for avoiding this problem is shown in FIG. 12, which illustrates a "cornerless" filter design using circular patterns of Cyan and Yellow filter material. The filter material may be deposited on the square pixels in the form of discs which are substantially circular in shape, and the diameters of which are substantially equal to the diagonals of the pixels on which they are deposited.

The advantages of this further embodiment are:
1. The photoresponse non-uniformity (PRNU) will be better because there are no corners, which are "five patterns" in a sense.
2. The circular filter design at the left in FIG. 12 has 50% White pixels that are reduced in sensitivity because the neighboring filters extend over positions of the pixel, which is of advantage since this tends to balance the three kinds of signals.

3. The net "White" signal becomes more like a luminance signal than a flat white signal, which is especially advantageous when the image processing is of the luminance-chrominance type.

As well as the circular shapes, the optimized design of this further embodiment may utilize discs having an octagonal shape wherein the octagons are "regular" and their size is adjusted to exactly balance the three signal levels for white light. That is, the sizes of the Yellow and Cyan octagons are adjusted separately so that all three signals are nominally equal to each other in the chosen kind of white light.

It will be seen that in all of the embodiments the color unit cell of the invention is a 2-pixel by 2-pixel block in the pattern:

| G  | Cy |
|----|----|
| Ye | W  |

This contrasts with the prior art cell shown in FIG. 1, which also has a combination of Cy, Ye, G and W, and the layout design of which also could be made using just a Cyan and a Yellow filter application. However, the layout would not take the form of Cyan stripes or Yellow stripes. The prior art design has as the repeating color pattern:

| Cy | W | Ye | G |
|----|---|----|---|
| Ye | G | Cy | W |

If made with the Cyan-Yellow process, the masks would have the following form:

| Cy |    | Cy | Cy |    |    | Ye | Ye |    |    |
|----|----|----|----|----|----|----|----|----|----|
|    | Cy | Cy |    |    | Ye | Ye |    |    | Ye | Ye |
| Cy |    | Cy | Cy |    |    | Ye | Ye |    |    |

With the present invention, the same combination is used, but in the first embodiment the four colors are specifically arranged so that the Cyan and Yellow masks consist of stripes. In the second embodiment, for example, which optimizes the design to deal with a dead or a defective column, the Cyan and Yellow mask layout looks like the above patterns except that they are oriented as vertical pairs instead of horizontal pairs, thus:

| Cy |    | Cy |    | Cy |    |    | Ye |    | Ye |    | Ye |
|    | Cy |    | Cy |    |    |    |    | Ye |    | Ye |    | Ye |
|    | Cy |    | Cy |    |    | Ye |    | Ye |    | Ye |    |
| Cy |    | Cy |    | Cy |    | Ye |    | Ye |    | Ye |    |

Consequently, the stripe pattern of the invention is clearly distinguishable from prior art patterns using Cyan and Yellow and an improvement thereover.

In operating a full-frame (FF) CCD imager chip produced by implementing the present invention, a sensed image charge may be read out after only one exposure. During or after readout, signal processing is done to generate the desired color image data file. This data file may be a Red-Green-Blue (RGB) file, a LUMINANCE-CHROMINANCES a and b file, or some other type of color image file. The present Cyan-Yellow stripe color design has several unique color-output features, as explained above, which can be achieved using the image data file. For example, a unit cell may be a block of 2 pixels by 2 pixels, made up of a Green, a Cyan, a Yellow, and a White pixel, and from one of these blocks, the Red level is {W−Cy}, and the Blue level is {W−Ye}. The LUMINANCE level is the sum of all four pixel levels. With appropriate signal processing, in between these 2-pixel×2-pixel blocks, by virtually shifting one pixel both vertically and horizontally, there are complementary 2×2 pixel blocks that can also be used to generate unique color image data providing an extensive color image data file.

In some applications it may be advantageous to have an opaque frame mask associated with the color filters. Such an arrangement may have a thin refractory metal mask under the color filters, which mask can be formed to give higher precision in both the uniformity of pixel sizes, and the uniformity of the pixel center-to-center spacing. More particularly, for achieving the best uniformity and least color crosstalk, one current method of making color sensors has been to first form an opaque grid using a thin layer of refractory metal, which acts as an opaque frame around the central aperture of each pixel. Refractory metals form the best thin layers because they tend to be the most uniform, and they are also less reflective than aluminum. One common metal for this purpose is the titanium-tungsten (TiW) alloy, and another is molybdenum (Mo). By applying the grid to the CCD array before applying the CFA, the grid lies closer to the active pixel structures and therefore the optical crosstalk is minimized. Also, with such a grid, the Green pixel can be made smaller so as to give a more traditional LUMINANCE spectrum for the resultant image data file. However, it is an advantage of the invention that the use of the opaque grid can be omitted thus simplifying the fabricating process.

In conclusion it will be seen that this invention provides a means for making high performance color imagers in a relatively low cost way because, in the CFA, there are only two color layers in the orthogonally arranged or staggered color filter stripes, and because the dimensions of the stripes are easier to control than the dimensions of pixel-sized squares that tend to have rounded corners which introduce a process control problem.

What is claimed is:

1. A CCD color image sensor, comprising:
    a CCD array;
    a plurality of continuous stripes of Cyan filter material disposed over said CCD array parallel to an axis of said CCD array; and
    a plurality of continuous stripes of Yellow filter material disposed over said CCD array and arranged perpendicular to said stripes of Cyan filter material,
    wherein said plurality of continuous stripes of Cyan filter material and said plurality of continuous stripes of Yellow filter material are arranged in separate layers with one layer passing over the other layer in crossing regions, and said pluralities of continuous stripes are arranged to form 2-pixel by 2-pixel blocks, with each block containing a Cyan pixel, a Yellow pixel, a Green pixel where the stripes overlap, and a White pixel where there is no stripe, and with the Cyan and Yellow pixels diagonally opposed and the Green and White pixels diagonally opposed.

2. A sensor as in claim 1 further comprising a planarizing layer of polyimide disposed between said separate layers.

3. A sensor as in claim 1 further comprising a thin refractory metal mask on said CCD array under said separate layers.

4. A sensor as in claim 1 wherein said one layer passing over said other layer has a substantially constant thickness and color quality, in said crossing regions and in regions where said layers do not cross.

5. A sensor as in claim 1 wherein said one layer passing over said other layer has a different thickness and different color quality, in said crossing regions and in regions where said layers do not cross.

6. A sensor as in claim 1 wherein said other layer has a different thickness and different color quality, in said crossing regions and in regions where said layers do not cross.

7. A CCD color image sensor, comprising:

a CCD array;

a plurality of stripes of Cyan filter material disposed over said CCD array parallel to an axis of said CCD array; and a plurality of stripes of Yellow filter material disposed over said CCD array and arranged perpendicular to said stripes of Cyan filter material, wherein said plurality of stripes of Cyan filter material and said plurality of stripes of Yellow filter material are arranged in separate layers with one layer passing over the other layer in crossing regions, and said pluralities of stripes are arranged to form 2-pixel by 2-pixel blocks, with each block containing a Cyan pixel, a Yellow pixel, a Green pixel where the stripes overlap, and a White pixel where there is no stripe, and with the Cyan and Yellow pixels diagonally opposed and the Green and White pixels diagonally opposed, and wherein one of said plurality of stripes of Cyan filter material and said plurality of stripes of Yellow filter material is arranged transversely and continuously across said CCD array, and the other one of said plurality of stripes of Cyan filter material and said plurality of stripes of Yellow filter material is arranged longitudinally, and each of said other one of said plurality of stripes of Cyan filter material and said plurality of stripes of Yellow filter material is segmented and alternately displaced transversely to form a checkerboard pattern with said one of said plurality of stripes of Cyan filter material and said plurality of stripes of Yellow filter material.

* * * * *